(12) United States Patent
Lowery

(10) Patent No.: US 8,076,833 B2
(45) Date of Patent: Dec. 13, 2011

(54) METHODS AND APPARATUSES FOR ENHANCING HEAT DISSIPATION FROM A LIGHT EMITTING DEVICE

(75) Inventor: Chris Lowery, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 235 days.

(21) Appl. No.: 12/164,540

(22) Filed: Jun. 30, 2008

(65) Prior Publication Data

US 2009/0322205 A1 Dec. 31, 2009

(51) Int. Cl.
*H01J 1/66* (2006.01)
*H01L 33/64* (2010.01)
(52) U.S. Cl. ........... 313/493; 313/500; 313/512; 257/98
(58) Field of Classification Search .................. None
See application file for complete search history.

(56) References Cited

U.S. PATENT DOCUMENTS

| | | | |
|---|---|---|---|
| 4,459,197 A | 7/1984 | Solomon | |
| 4,501,993 A | 2/1985 | Mueller et al. | |
| 4,563,617 A | 1/1986 | Davidson | |
| 4,626,694 A | 12/1986 | Sano et al. | |
| 5,442,256 A | 8/1995 | Moyer et al. | |
| 6,919,504 B2 | 7/2005 | McCutcheon et al. | |
| 7,902,563 B2 * | 3/2011 | Kim et al. | 257/98 |
| 2004/0259363 A1 * | 12/2004 | Bawendi et al. | 438/689 |
| 2005/0151555 A1 * | 7/2005 | Lewis et al. | 324/760 |
| 2005/0184638 A1 * | 8/2005 | Mueller et al. | 313/485 |
| 2005/0253153 A1 * | 11/2005 | Harada | 257/79 |
| 2005/0255784 A1 * | 11/2005 | Hayashi et al. | 445/39 |
| 2006/0054915 A1 * | 3/2006 | Chang | 257/100 |
| 2006/0186425 A1 | 8/2006 | Yano et al. | |

* cited by examiner

*Primary Examiner* — Anne Hines
*Assistant Examiner* — Tracie Green
(74) *Attorney, Agent, or Firm* — Arent Fox LLP

(57) ABSTRACT

A light emitting device and method of producing the same is disclosed. The light emitting device includes a phosphor layer and a wire mesh thermally coupled to the phosphor layer and configured to dissipate heat from the phosphor layer.

19 Claims, 4 Drawing Sheets

METHODS AND APPARATUSES FOR ENHANCING HEAT DISSIPATION FROM A LIGHT EMITTING DEVICE

BACKGROUND

1. Field

The present disclosure relates to light emitting devices, and more particularly, to semiconductor light emitting devices with a system for dissipating heat from a phosphor layer.

2. Background

Light emitting diodes (LEDs) are attractive candidates for replacing conventional light sources, such as incandescent lamps and fluorescent light sources. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Furthermore, LEDs require lower voltages than fluorescent lamps, and therefore, are better suited for applications in which the light source must be powered from a low-voltage source, such as a battery or an internal computer DC power source.

Unfortunately, LEDs produce light in a relatively narrow spectrum band. To replace conventional lighting sources, LEDs that generate light that appears to be "white" to the human observer are required. A light source that appears to be white and that has a conversion efficiency comparable to that of fluorescent light sources can be constructed from a blue light emitting semiconductor covered with a layer of phosphor that converts a portion of the blue light to yellow light. If the ratio of blue to yellow light is chosen correctly, the resultant light source appears white to a human observer. In applications requiring high power illumination, however, the phosphor layer may overheat because in the conversion process it itself generates heat. The heat, if not sufficiently dissipated, may cause premature degradation of the phosphor layer, decreasing the device's performance and life-span.

To prevent the phosphor layer from overheating, many contemporary devices are designed with the phosphor layer mounted further away from the light emitting semiconductor. This approach, however, creates additional problems. Increasing the distance between the phosphor layer and the light emitting semiconductor increases the size of the device and also increases the size of the source, which is optically undesirable. It also increases the manufacturing cost of the device. Moreover, such a design does not effectively address the heat dissipation issue as it does not provide any means for dissipating the heat away from the phosphor layer.

Accordingly, although contemporary LEDs have proven generally suitable for their intended purposes, they possess inherent deficiencies which detract from their overall effectiveness and desirability. As such, there exists a need for small, high-power "white light" LEDs with a system for dissipating heat from the phosphor layer.

SUMMARY

In one aspect of the disclosure, a light emitting device includes a phosphor layer and a wire mesh thermally coupled to the phosphor layer and configured to dissipate heat from the phosphor layer.

In another aspect of the disclosure, a light emitting device includes a phosphor layer having a first thermal conductivity and a wire mesh thermally coupled to the phosphor layer and having a second thermal conductivity that is greater than the first thermal conductivity.

In a further aspect of the disclosure, a method for manufacturing a light emitting device includes forming a wire mesh and depositing at least one phosphor mixture onto the wire mesh.

It is understood that other aspects of light emitting devices will become readily apparent to those skilled in the art from the following detailed description, wherein it is shown and described only in examples of various aspects of light emitting devices by way of illustration. As will be realized, the various aspects of light emitting devices disclosed herein are capable of modification in various other respects, all without departing from the spirit and scope of the present disclosure. Accordingly, the drawings and detailed description that follow are to be regarded as illustrative in nature and not as restrictive.

BRIEF DESCRIPTION OF THE DRAWINGS

Various aspects of the present disclosure are illustrated by way of example, and not by way of limitation, in the accompanying drawings, wherein.

DETAILED DESCRIPTION

The detailed description set forth below in connection with the appended drawings is intended as a description of various aspects of light emitting devices and is not intended to represent all ways in aspects of the present invention may be practiced. The detailed description may include specific details for the purpose of providing a thorough understanding of various aspects of light emitting devices; however, it will be apparent to those skilled in the art that the present invention may be practiced without these specific details. In some instances, well-known structures and components are summarily described and/or shown in block diagram form in order to avoid obscuring the concepts of the present invention.

Furthermore, various descriptive terms used herein, such as "provided on" and "transparent," should be given the broadest meaning possible within the context of the present disclosure. For example, when a layer is said to be "provided on" another layer, it should be understood that that one layer may be deposited, etched, attached, or otherwise prepared or fabricated directly or indirectly above that other layer. Also, something that is described as being "transparent" should be understood as having a property allowing no significant obstruction or absorption of electromagnetic radiation in the particular wavelength (or wavelengths) of interest.

Figure 1:
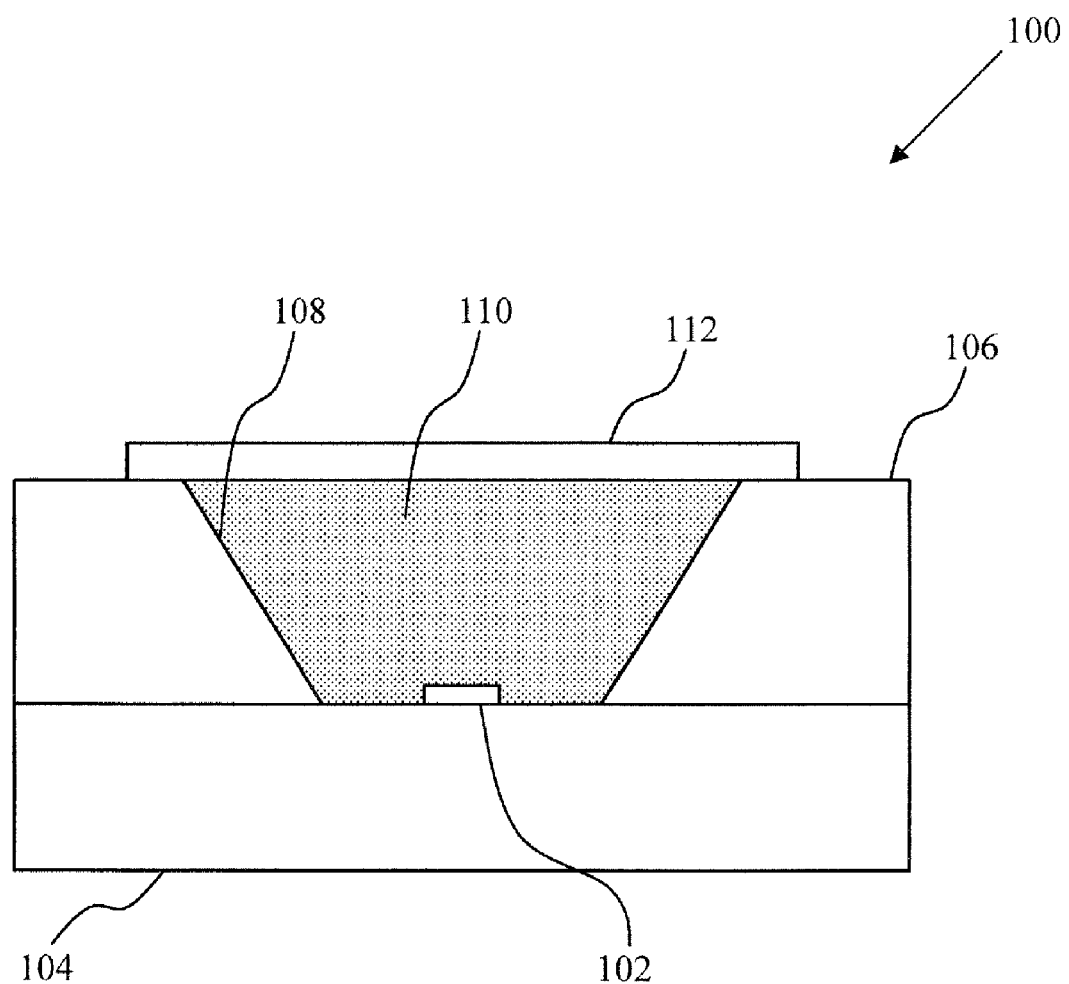
FIG. 1 is a cross-section view illustrating an example of a device having a phosphor layer.

FIG. 1 is a cross-section view illustrating an example of a device 100 having a phosphor layer 112. In this example, the device may include a blue light emitting semiconductor 102 provided on a substrate 104. The light emitting semiconductor 102 may be driven by a power source (not shown) that is electrically coupled to the light emitting semiconductor via electrically conductive traces (not shown). The substrate 104 may be an insulating material, such as ceramic or epoxy laminate, for example. A recessed housing 106, which is provided on the substrate 104, may be formed by boring a conical cavity in a layer of a material, such as ceramic, resin, polyphthalimide, polycarbonate, or some other suitable material; coating an inner wall 108 of the cavity with a reflective material, such as, for example, aluminum, silver, or a suitable plastic impregnated via injection molding with titanium dioxide, for example; and then bonding the housing 106 onto the substrate 104. Alternatively, the recessed housing 106 may be formed by boring a conical cavity in the substrate 104. The light emitting semiconductor 102 may be bonded to the substrate 104 after the housing 106 is formed.

After the light emitting semiconductor 102 is bonded to the substrate 104, a transparent index-matching material 110, such as silicone, is deposited into the cavity of the housing 106. Thereafter, the phosphor layer 112 may be provided on the housing 106 covering the transparent material 110 and the light emitting semiconductor 102.

The phosphor layer 112 is used in combination with the light emitting semiconductor 102 to create light with a range of color temperatures and spectral composition. The phosphor layer 112 may include a mixture of silicone and phosphor particles, which are evenly dispersed and suspended within the silicone. The phosphor particles may be of different colors (e.g., yellow, red, blue) in order to enhance a color rendering index of the light produced by the device 100. The phosphor layer 212 may have a round disk-like shape in order to provide a uniform radiation pattern.

During operation, the light emitting semiconductor 102 may emit a blue light. A portion of the blue light may be absorbed by the phosphor particles of the phosphor layer 112 and the remaining blue light may pass through the phosphor layer 112. Once the blue light is absorbed by a phosphor particle, the phosphor particle may emit a light of its respective color. This secondary emission of colored light from the phosphor particle, also known as a Stokes shift, is optically mixed with the remaining blue light, and the mixed spectra thus produced is perceived by the human eye as being white.

Unfortunately, the Stokes Shift process for converting blue light to other wavelengths in the phosphor is not 100% efficient. Each photon of blue light absorbed by the phosphor particle may not always produce a photon of a different wavelength. This lost energy is absorbed by the phosphor and is emitted as heat into the phosphor layer 112. For small devices, this generated heat is very small and typically has no significant effect on the performance of the device. But for more powerful devices, such as those exceeding 1 watt in consumed electrical power, the amount of heat generated inside the phosphor layer becomes significant if it is not sufficiently dissipated. Excessive heat may consequently degrade the phosphor layer and reduce its efficiency. That is, the phosphor layer will still absorb the same amount of radiant optical power, but will emit less light. As a result, the luminance may decrease and the color temperature may shift from white to blue, adversely affecting the performance of the device 100. In order to dissipate the heat generated within the phosphor layer 112, a heat dissipating structure may be integrated into the light emitting device, as shown in FIG. 2.

Figure 2:
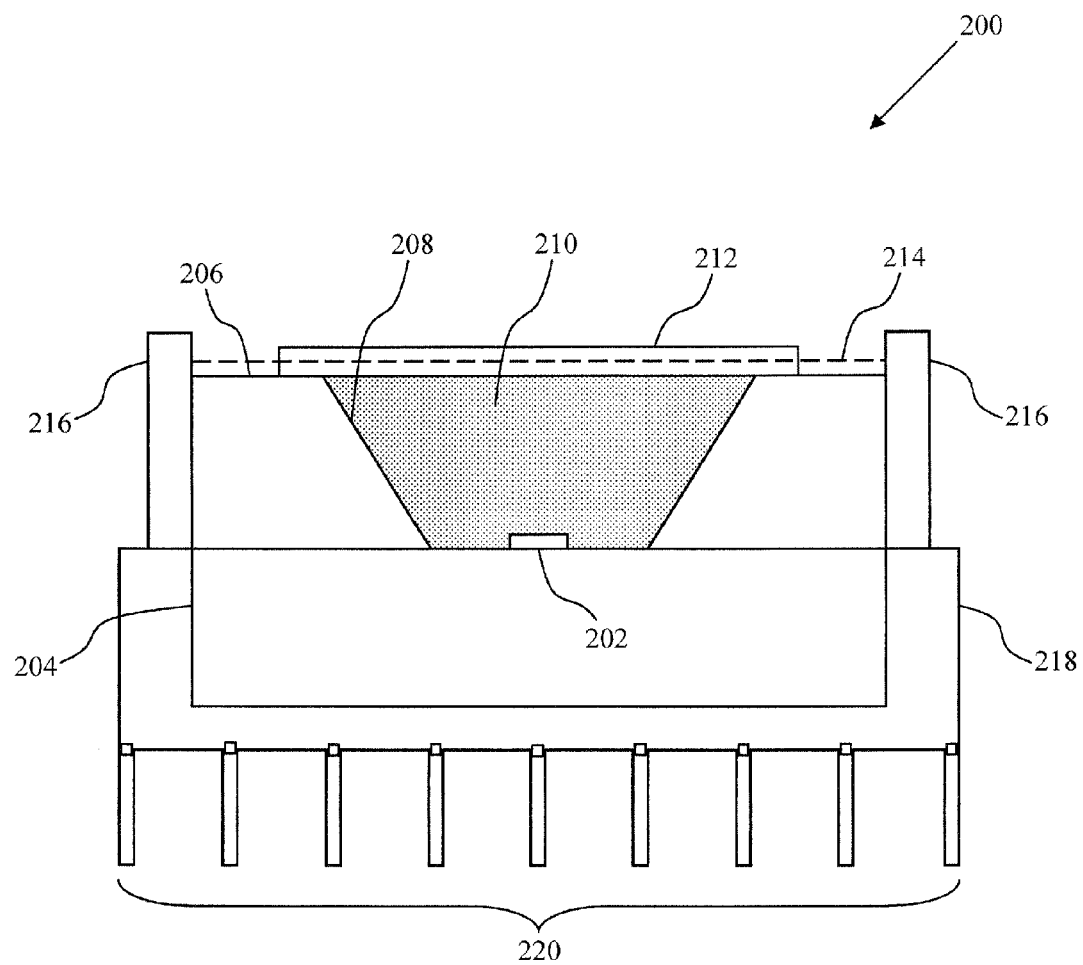
FIG. 2 is a cross-section view illustrating an example of a device having a phosphor layer with enhanced heat dissipation.

FIG. 2 is a cross-section view illustrating an example of a device 200 having an enhanced heat dissipation structure. Light emitting semiconductor 202, substrate 204, recessed housing 206, reflective inner wall 208, and transparent material 210 of FIG. 2 correspond to the light emitting semiconductor 102, substrate 104, housing 106, inner wall 108, and transparent material 110 of FIG. 1, respectively, and as such, their respective descriptions are omitted. The heat dissipating structure of device 200 may include a wire mesh 214, a ring 216, heat sink 218, and fins 220. The wire mesh 214 may be provided within the phosphor layer 212, as shown in FIG. 2, or on either the top or bottom surface of the phosphor layer 212. Furthermore, the heat dissipating structure of the device 200 is not limited to only the single wire mesh 214, but can include a plurality of wire meshes, which may be provided anywhere within or on the phosphor layer 214.

The wire mesh 214 may be thermally coupled to the ring 216 by any suitable method, such as welding, soldering, or mechanical crimping, for example. The ring 216 may be thermally coupled to the heat-sink 218, as shown in FIG. 2. The ring 216 and the heat-sink 218 may be provided at the outer side walls of the housing 206 and the substrate 204, with the heat-sink 218 also supporting the bottom of the substrate 204. The ring 216, the heat-sink 218, and the fins 220 may all be composed of a heat conductive material, such as copper, aluminum, aluminum nitride, or diamond, for example.

Figure 3:
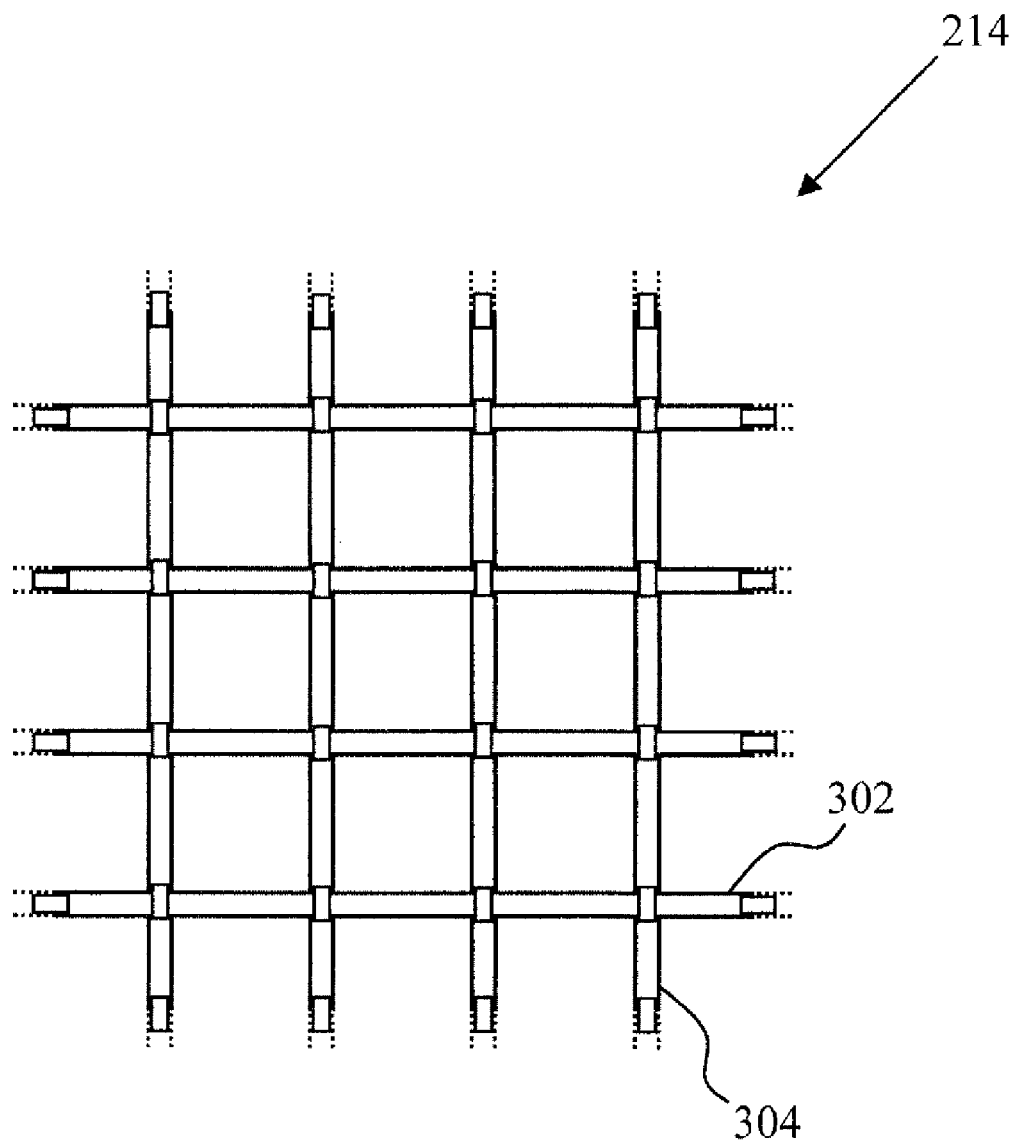
FIG. 3 is a top view illustrating an example of a mesh, as shown in FIG. 2.

FIG. 3 is a top view illustrating an example of the wire mesh 214, as shown in FIG. 2. In this example, the mesh 214 is shown to be a plurality of intersecting wires 302 and 304. The wires can be composed of a material having a thermal conductivity greater than that of silicone, such as copper, copper alloy, steel, steel alloy, aluminum, aluminum alloy, aluminum nitride, carbon fiber, and the like. The wire mesh 214 may be formed by any method that thermally interconnects the wires 302 and 304, such as weaving, stamping, or etching, for example. The pattern formed by the wires may be a square array, as shown in FIG. 2, or any other kind of array involving any number of intersecting wires. The respective wire densities of wires 302 and 304 may be any number of wires per inch, and the wire density ratio between the wires 302 and 304 may also be any number. For example, the wire density of wires 302 may be 50 wires per inch and the wire density of the wires 304 may also be 50 wires per inch. The diameter of the respective wires 302 and 304 may also be any size that allows for sufficient dissipation of heat from the phosphor layer 212 while maintaining a minimum obstruction to emitted light. For example, the diameter of each of the wires 302 and 304 can be 0.0017 inches. Furthermore, the wires 302 and 304 may have any cross-sectional shape, such as round, oval, square, or rectangular, for example. All of the different parameters of the wire mesh 214 may be individually varied to optimize the balance between the rate of heat dissipation and the luminance of the device 200.

Referring back to FIG. 2, during operation of the device 200, the heat generated by the phosphor particles in the phosphor layer 212 may be transversely dissipated from the phosphor layer 212 to the ring 216 via the wire mesh 214. The ring 216 transfers the heat to the heat-sink 218, which in turn vents the heat to the outside environment via the fins 220. As such, the phosphor layer 212 is cooled, preventing the degradation of the phosphor layer 212.

In addition to providing effective cooling for the phosphor layer 212, the wire mesh 214 may strengthen the phosphor layer 212 by acting as a physical support matrix within the phosphor layer 212. The phosphor layer 212 may thus be made thinner, allowing the light traveling through the phosphor layer 212 to follow a shorter mean free path. This reduces the probability that a phosphor particle will absorb the light emitted by an adjacent phosphor particle, and thus, increases the efficiency of the device 200.

Figure 4:
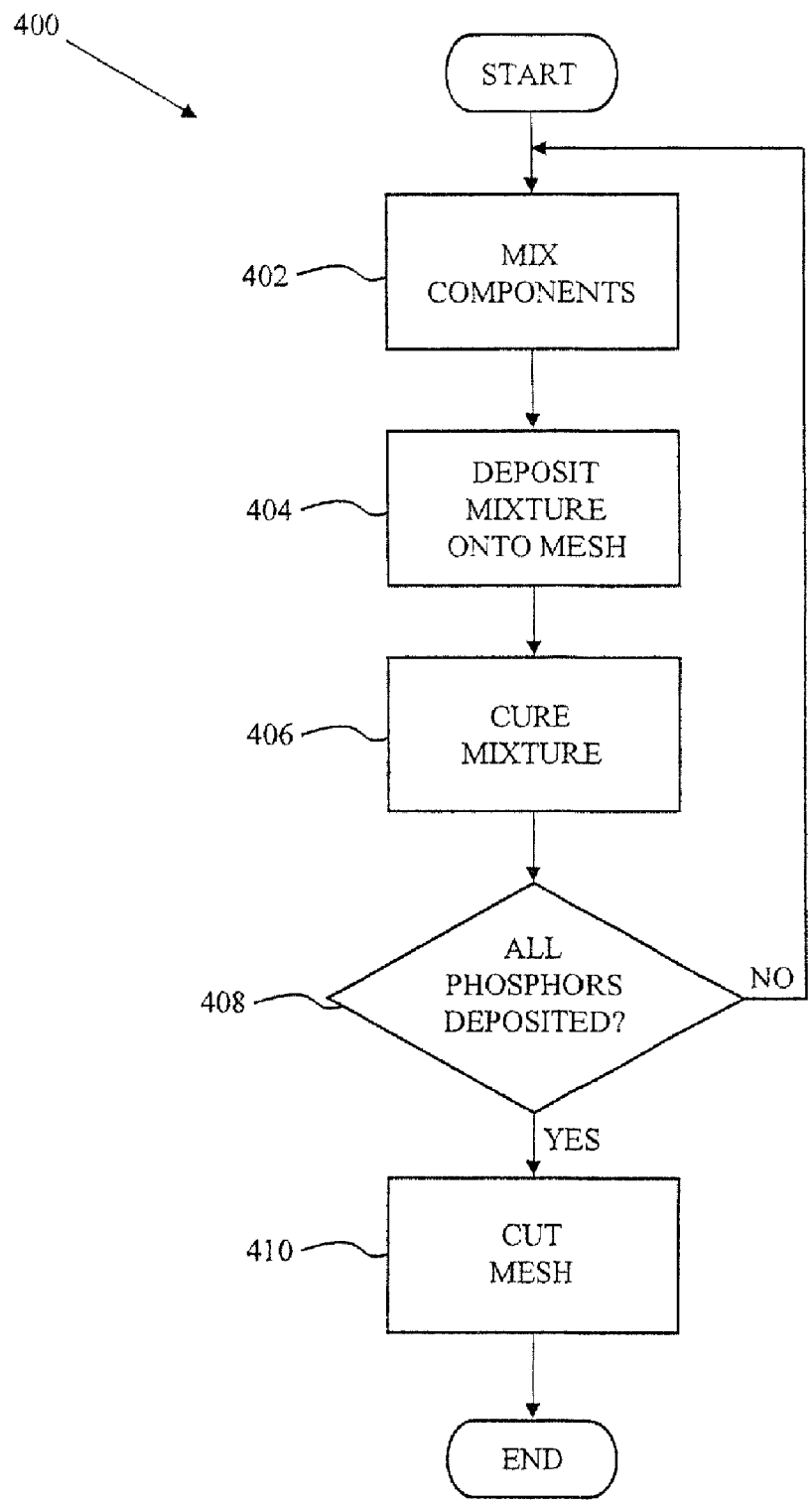
FIG. 4 is a flow-chart diagram illustrating an example of a process for combining a phosphor layer and a mesh.

FIG. 4 is a flow-chart diagram 400 illustrating an example of a process for combining the phosphor layer 212 and the wire mesh 214. The process begins and proceeds to block 402, where various components of the phosphor layer 212 are mixed. For example, a specific amount of phosphor powder of one particular color or a combination of colors (e.g., yellow, red, green) may be mixed with a specific amount of carrier, such as liquid silicone. The phosphor powder may contain phosphor particles having a diameter of about 3 μm to 25 μm, but is not limited thereto. The phosphor powder and the carrier may be mixed in a vacuum oven at about 50 degrees Celsius in order to effectively mix and degas the mixture so that the phosphor particles are suspended and evenly dispersed within the carrier and the mixture is substantially devoid of gas bubbles.

Once the mixture is prepared, the process proceeds to block 404, where the mixture is uniformly deposited onto a mesh via screen-printing, stenciling, or any other suitable method. A device, such as that used for manufacturing circuit boards, may be used for this purpose. The mixture may be deposited to cover a large portion of the mesh area as one continuous layer, a particular pattern, or an array of dots, for example. The thickness of the deposited mixture may be controlled to obtain a desired final thickness of the phosphor layer.

After the mixture is deposited onto the mesh, the process proceeds to block 406, where the mixture is cured for a predetermined amount of time (e.g., 30 minutes) at a specific temperature.

After the deposited mixture is cured, the process proceeds to block 408, where a determination is made as to whether all of the desired phosphors (e.g., colors and/or types of phosphor particles) are present on the mesh. If it is determined that not all of the desired phosphors are present on the mesh, then the process proceeds back to block 402 where a phosphor powder of an additional color and/or type is mixed with the carrier and the process proceeds down through blocks 404-408 until all of the desired phosphors are present on the mesh. If, at block 408, it is determined that all of the desired phosphors are present on the mesh, then the process proceeds to block 410. At block 410 the cured mixture and mesh are cut into predetermined shapes (e.g., circular discs) by a die cutter or a similar device. After block 410, the process ends.

In order to facilitate the thermal coupling of the wire mesh to the ring 216, the wire mesh at the edges of the die-cut disc may be exposed by removing parts of the phosphor layer around the perimeter of the disc. This may be accomplished by some chemical and/or mechanical means such as a high pressure water jet, for example. Alternatively, the phosphor layer may be patterned on the mesh such that the die-cut disc may already have the wire mesh exposed at the edges.

In the case where the process undergoes an iteration for each different phosphor powder, in block 404, each phosphor mixture may be deposited onto the mesh as a separate layer in a stacked phosphor layer structure. Alternatively, each phosphor mixture may be deposited within its respective space on the wire mesh in a predetermined array. The resulting phosphor layer may be a combination of a plurality of stacked layers and arrays of phosphor mixtures. This may be done with a specific lithographic pattern when screen-printing each mixture. The array may be such that each phosphor mixture is deposited so as not to overlap with a neighboring phosphor mixture. It may be desirable to deposit the different color phosphors in such an array to decrease the absorption of light by neighboring phosphor particles of different color. Furthermore, depositing each phosphor mixture separately, whether in a stacked manner or in an array, allows for incompatible phosphor mixtures to exist within the resulting phosphor layer, wherein the incompatible phosphor mixtures are localized within their respective layers and/or areas within the array. The different types of phosphor mixtures may, for example, include garnet structure phosphors (e.g., yttrium aluminum garnet, terbium aluminum garnet), sulfide phosphors (e.g., zinc sulfide, strontium sulfide), selenide phosphors (e.g., cadmium selenide, zinc selenide), silicate phosphors (e.g. barium silicate, strontium silicate, calcium silicate) and alkali halide phosphors (e.g., cesium chloride, potassium bromide). Any of the foregoing phosphors may be activated by cerium, europium, or other similar rare earth metals familiar to those skilled in the art.

LEDs with a heat dissipation structure including a phosphor layer integrated with a mesh may be used in numerous applications. By way of example, these LEDs may be well suited for liquid crystal display (LCD) backlighting applications. Other applications may include, but are not limited to, automobile interior lighting, light bulbs, lanterns, streetlights, flashlights, or any other application where LEDs are used.

The above description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light emitting device, comprising:
   a substrate having a cavity;
   a wire mesh coupled to a mesh support member, wherein the wire mesh is arranged above and apart from the cavity and the substrate;
   a phosphor layer thermally coupled to the wire mesh, wherein the wire mesh is configured to dissipate heat from the phosphor layer, and wherein the mesh support member comprises a thermally conductive material apart from the cavity and the substrate, the mesh support member being thermally coupled to the wire mesh; and
   a heat sink coupled to the mesh support member, wherein the wire mesh thermally couples the phosphor layer to the heat sink via the mesh support member.

2. The light emitting device of claim 1, wherein the wire mesh is formed of a material selected from a group consisting of copper, copper alloy, steel, steel alloy, aluminum, aluminum alloy, aluminum nitride, and carbon fiber.

3. The light emitting device of claim 1, wherein a portion of the wire mesh is embedded within the phosphor layer.

4. The light emitting device of claim 1, wherein the phosphor layer includes a plurality of phosphor sections.

5. The light emitting device of claim 4, wherein the phosphor sections are an array of phosphor dots.

6. The light emitting device of claim 4, wherein the phosphor sections are a plurality of phosphor layers stacked one on top of another.

7. The light emitting device of claim 4, wherein at least one of the phosphor sections is configured to produce light of a color different from that of at least another one of the phosphor sections.

8. The light emitting device of claim 4, wherein at least one of the phosphor sections includes phosphor particles of a type different from that of at least another one of the phosphor sections.

9. The light emitting device of claim 1, further comprising at least one other wire mesh thermally coupled to the phosphor layer.

10. The light emitting device of claim 1, wherein the wire mesh includes wires having a wire density of 50 wires per inch.

11. The light emitting device of claim 1, wherein the wire mesh includes at least one wire having a diameter of 0.0017 inches.

12. The light emitting device of claim 1, wherein the wire mesh includes wires configured in a substantially square array.

13. A light emitting device, comprising:
a substrate having a cavity;
a wire mesh having a first thermal conductivity, wherein the wire mesh is arranged above and apart from the cavity and the substrate;
a phosphor layer having a second thermal conductivity formed above and apart from the cavity and the substrate, wherein the phosphor is thermally coupled to the wire mesh, and wherein the first thermal conductivity is greater that the second thermal conductivity;
a mesh support member thermally coupled to the wire mesh, wherein the mesh support member comprises a thermally conductive material apart from the substrate; and
a heat sink coupled to the mesh support member, wherein the wire mesh thermally couples the phosphor layer to the heat sink via the mesh support member.

14. A method for manufacturing a light emitting device, comprising:
forming a cavity in a substrate;
forming a wire mesh;
attaching the wire mesh above the cavity and the substrate to a mesh support member, wherein the mesh support member comprises a thermally conductive material apart from the substrate, and wherein the wire mesh is arranged above and apart from a light-emitting semiconductor and the substrate;
attaching the mesh support member to a heat sink, wherein the wire mesh is arranged in thermal contact with the heat sink via the mesh support member; and
depositing at least one phosphor mixture onto the wire mesh.

15. The method of claim 14, wherein one of the phosphor mixtures is deposited in a first array of phosphor sections and another one of the phosphor mixtures is deposited in a second array of phosphor sections such that the phosphor sections of the first array do not overlap the phosphor sections of the second array.

16. The method of claim 14, wherein one of the phosphor mixtures is deposited as a first continuous layer and another one of the phosphor mixtures is deposited as a second continuous layer on top of the first continuous layer so as to form a stacked phosphor layer structure.

17. The method of claim 14, wherein at least one of the phosphor mixtures is configured to produce light of a color different from that of at least another one of the phosphor mixtures.

18. The method of claim 14, wherein at least one of the phosphor mixtures includes phosphor particles of a type different from that of at least another one of the phosphor mixtures.

19. The method of claim 14, wherein the formed wire mesh is formed of a material selected from a group consisting of copper, copper alloy, steel, steel alloy, aluminum, aluminum alloy, aluminum nitride, and carbon fiber.

* * * * *